United States Patent [19]

Redwine et al.

[11] 4,208,727

[45] Jun. 17, 1980

[54] SEMICONDUCTOR READ ONLY MEMORY USING MOS DIODES

[75] Inventors: Donald J. Redwine; G. R. Mohan Rao, both of Houston, Tex.

[73] Assignee: Texas Instruments Incorporated, Dallas, Tex.

[21] Appl. No.: 915,633

[22] Filed: Jun. 15, 1978

[51] Int. Cl.² .............................................. G11C 17/06
[52] U.S. Cl. ..................................... 365/105; 357/41; 357/45; 365/104
[58] Field of Search ....................... 365/103, 104, 105; 357/41, 45

[56] References Cited

U.S. PATENT DOCUMENTS

| 3,865,651 | 2/1975 | Arita | 365/104 |
| 3,914,855 | 10/1975 | Cheney et al. | 365/104 |
| 4,059,826 | 11/1977 | Rogers | 365/104 |

OTHER PUBLICATIONS

Cook et al., Read-Only Memory Fabrication by Laser Formed Connections, IBM Technical Disclosure Bulletin, vol. 15, No. 8, Jan. 1973, pp. 2371-2372.

*Primary Examiner*—Stuart N. Hecker
*Attorney, Agent, or Firm*—John G. Graham

[57] ABSTRACT

A semiconductor integrated circuit functioning as a read only memory or ROM employs MOS diodes as the memory cells and is formed by a process compatible with standard N-channel silicon gate manufacturing methods. Row address lines are metal strips and gates are polysilicon segments, while output or column lines are defined by elongated N+ regions. The gates are shorted to N+ drain regions to provide diode-like cells. Each MOS transistor in the array is programmed to be a logic "1" or "0", such as by ion implanting through the polysilicon gates and thin gate oxide, rendering some cells of such high threshold that they will not turn on. Alternatively, the array may be contact programmable.

4 Claims, 10 Drawing Figures

SEMICONDUCTOR READ ONLY MEMORY USING MOS DIODES

BACKGROUND OF THE INVENTION

This invention relates to semiconductor memory devices, and more particularly to an N-channel silicon gate MOS read only memory and a process for making it.

Storage of fixed programs in digital equipment such as minicomputers and microprocessor systems is usually provided by MOS read only memory devices or "ROMs". The economics of manufacture of semiconductor devices such as ROMs, and of mounting them on circuit boards in the system, are such that the number of memory bits per semiconductor chip is advantageously as high as possible. ROMs of up to 32K bits (32768) are typical at present. Within a few years, standard sizes will progress through 64K, 128K, 256K and 1 megabit. This dictates that cell size for the storage cells of the ROM be quite small. Metal gate ROMs of small size can be relatively easily fabricated in the manner set forth in U.S. Pat. No. 3,541,543, assigned to Texas Instruments, but usually these are programmed by the gate level mask which is at an early stage in the process. Most microprocessor and computer parts are now made by the N-channel silicon gate process because of the shorter access times provided. In the past, the N-channel process has not been favorable to layout of ROM cells of small size and/or programming has been by the moat mask, also early in the process. N-channel ROMs are disclosed in prior applications Ser. No. 761,612, filed Jan. 29, 1977 now U.S. Pat. No. 4,148,471 and Ser. No. 701,932, filed July 1, 1976 now abandoned, Ser. Nos. 890,555, 890,556 and 890,557, filed Mar. 20, 1978, and Ser. No. 900,549, filed Apr. 27, 1978 all assigned to Texas Instruments. A series ROM and method of programming is shown in U.S. Pat. No. 4,059,826 to Gerald D. Rogers, assigned to Texas Instruments. Also, previous cells have been programmed at the metal level mask by contact areas between metal lines and polysilicon gates, or by contacts between metal lines and N+ source or drain regions, using excessive space on the chip.

It is the principal object of this invention to provide a semiconductor device such as a permanent store memory cell of small size. Another object is to provide a small-area memory cell which is made by a process compatible with standard N-channel silicon gate manufacturing techniques.

SUMMARY OF THE INVENTION

A semiconductor integrated circuit functioning as a read only memory or ROM employs MOS diodes as the memory cells and is formed by a process compatible with standard N-channel silicon gate manufacturing methods. Row address lines are metal strips and gates are polysilicon segments, while output or column lines are defined by elongated N+ regions. The gates are shorted to N+ drain regions to provide diode-like cells. Each MOS transistor in the array is programmed to be a logic "1" or "0", such as by ion implanting through the polysilicon gates and thin gate oxide, rendering some cells of such high threshold that they will not turn on. Alternatively, the array may be contact programmable.

BRIEF DESCRIPTION OF THE DRAWINGS

The novel features believed characteristic of the invention are set forth in the appended claims. The invention itself, however, as well as other features and advantages thereof, which follows, read in conjunction with the accompanying drawings, wherein:

DETAILED DESCRIPTION OF SPECIFIC EMBODIMENT

Figure 1:
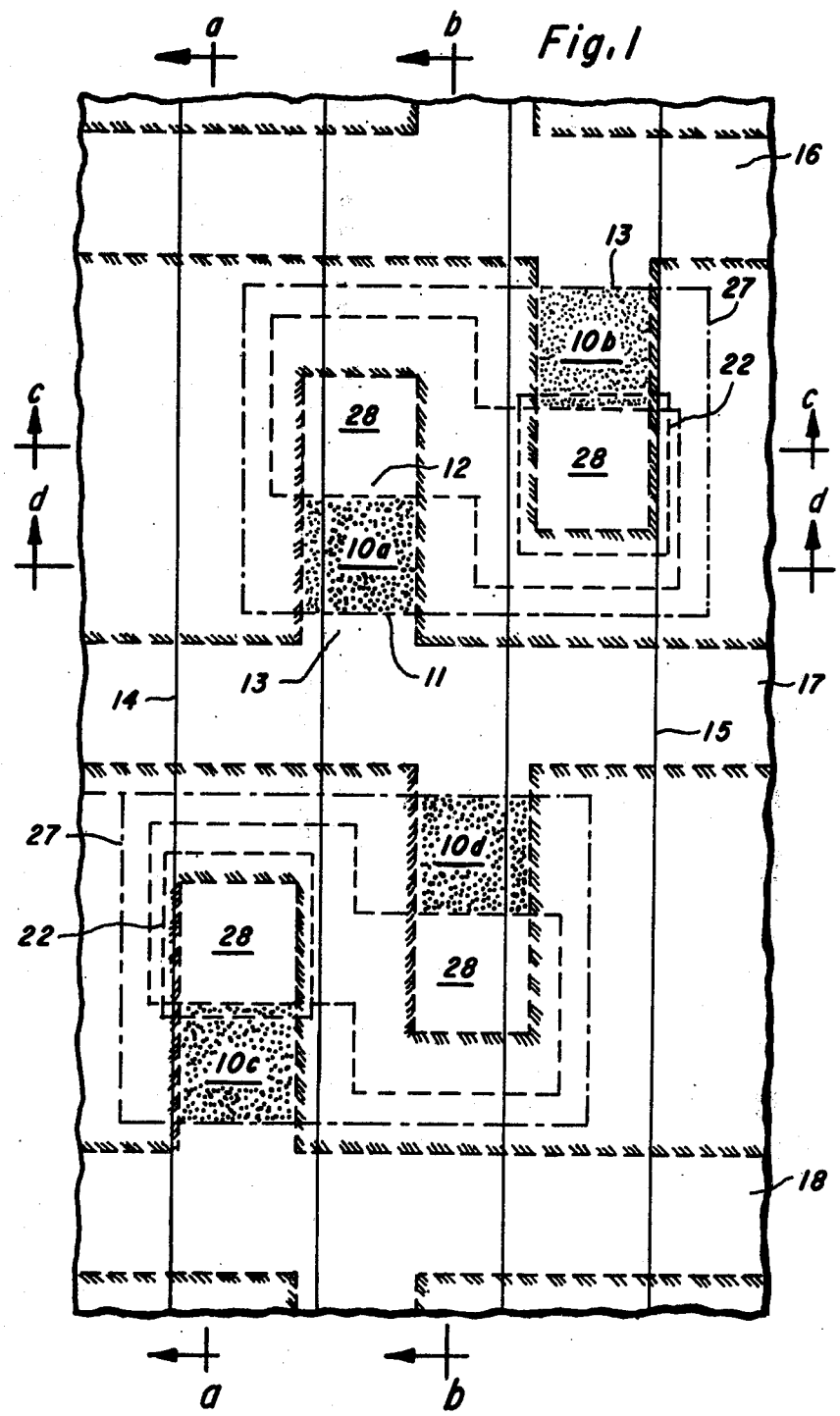
FIG. 1 is a greatly enlarged plan view of a small portion of a semiconductor chip showing the physical layout of a part of a ROM array made according to the invention.
Figure 2:
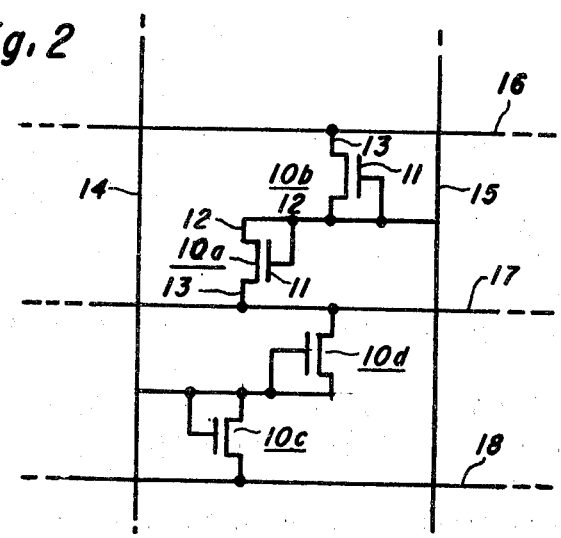
FIG. 2 is an electrical schematic diagram of the ROM of FIG. 1.
Figure 3A:
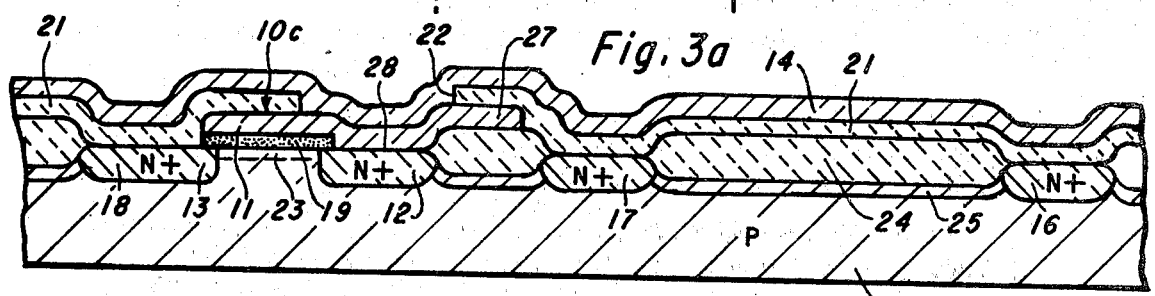
FIGS. 3a-3d are elevation views in section of the cell of FIG. 1, taken along the lines a—a, b—b, c—c, and d—d, respectively.
Figure 3B:
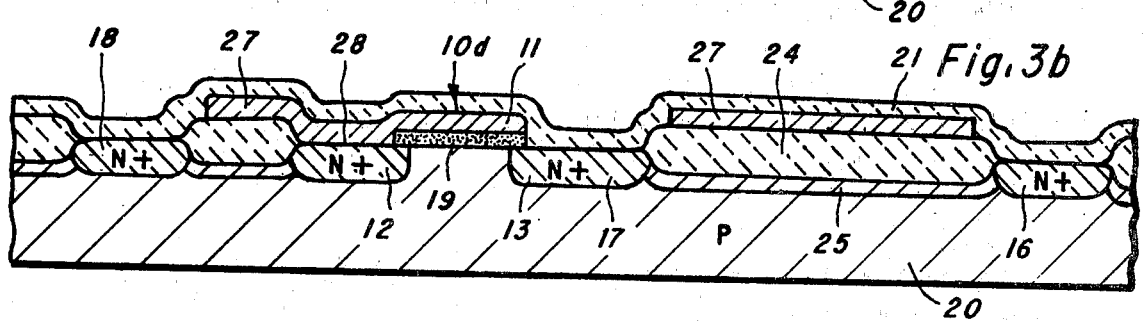
Figure 3C:
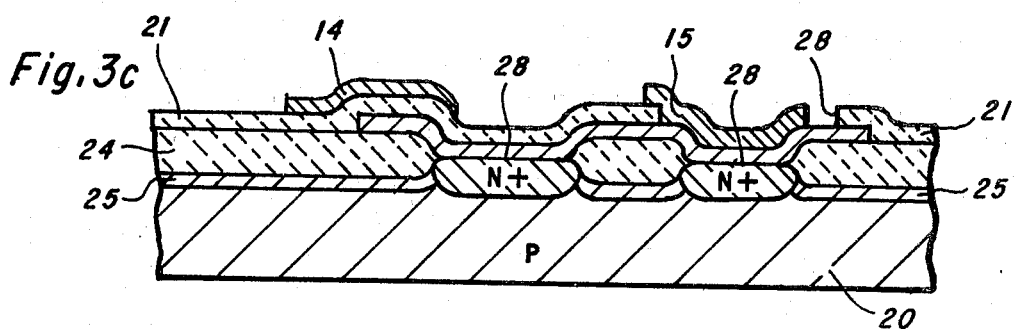
Figure 3D:
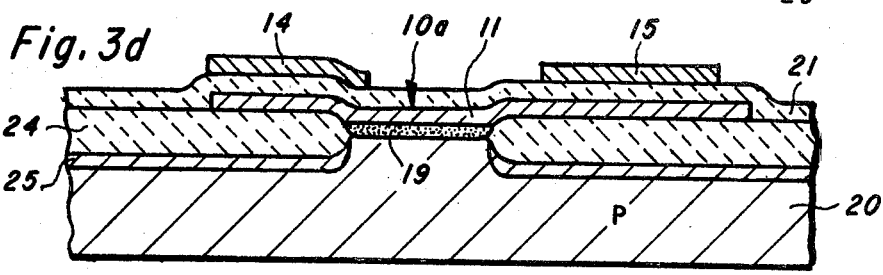

With reference to FIGS. 1, 2, and 3a-3d, a read only memory is illustrated which uses the drain-shorted-to-gate transistors according to the invention. The array consists of a large number of cells 10; only four complete cells 10a, 10b, 10c and 10d are shown. Each cell is an MOS transistor having a gate 11, and drain 12 and a source 13, with the drain of each transistor being shorted to its gate. The polysilicon gates 11 are connected to metal strips 14 and 15 which are the X address lines for the array. The sources and drains extend from N+ diffused regions 16, 17, and 18 which are Y output lines. The array, formed on a silicon bar 20, would typically contain perhaps 64K, 128K or 256K cells, so the bar would be much less than about 200 mils on a side or 40,000 sq. mil area depending upon the bit density. The four cells 10 shown would be on a minute part of the bar, perhaps less than one mil wide. A 64K ROM would require 256 of the X address lines such as 14 and 15 and 256 of the Y lines like the lines 16 to 18, providing 65,536 bits.

The cell array may be programmed by boron implant, either through the polycrystalline silicon gates 11 and gate oxide 19, or prior to deposition of the poly, to dope the surface more heavily than the original silicon substrate 20 and raise the threshold voltage of selected ones of the cells 10 to a value above that which will be turned on by the voltage on the selected address line 14, 15, etc. In the example of four complete cells shown, the upper right cell and the lower left cell are implanted in this manner, the others are not. An interlevel oxide layer 21 insulates the metal level from the underlying polycrystalline silicon, except at aperatures 22 where contact 13 is made to the gates 11. One contact aperature 22 is shared by two cells, e.g. cells 10a and 10b, conserving space on the chip. The interlevel layer 21 is non-thermal oxide deposited at low temperature in accord with standard MOS manufacturing methods. The ion implant creates implanted regions 23 in the channel areas of the selected transistors 10. The regions 23 are doped more heavily P-type than the substrate 20. A thick field oxide coating 24 covers parts of the bar not occupied by the transistors or diffused interconnects, and P+ channel stop regions 25 are formed underneath all the thick field oxide.

According to this embodiment of the invention, the polysilicon gates 11 are parts of larger polycrystalline silicon segments 27 which are connected to the metal lines 14 or 15 at the contact areas 22 and also connected to the respective drain region 12 and Y line 16, 17 or 18 at a contact area 28. This creates an MOS diode for each cell, and the diode will be conductive or nonconductive when a positive voltage of perhaps Vdd or +5 v is applied to its drain 12, depending upon whether or not a region 23 has been implanted for this cell.

Figure 4A:
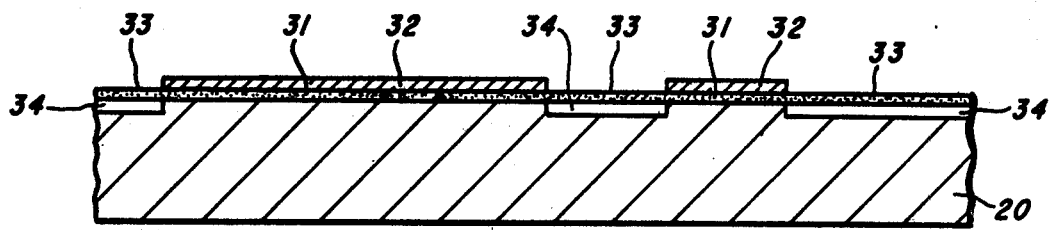
FIGS. 4a-4c are elevevation views in section of the ROM array and a transistor in the peripheral part of the semiconductor device of FIGS. 1 and 3a-3d, at successive stages in the manufacturing process, taken generally along the line a—a in FIG. 1.
Figure 4B:
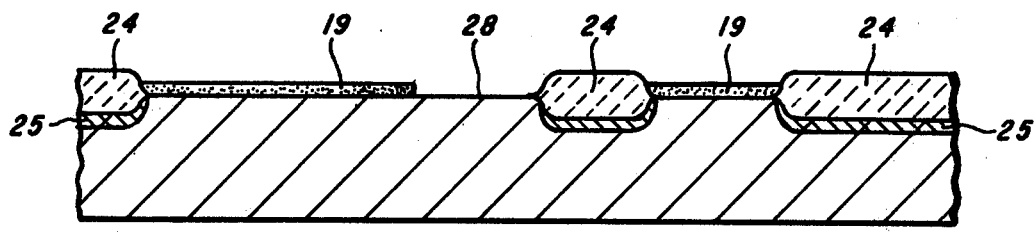
Figure 4C:
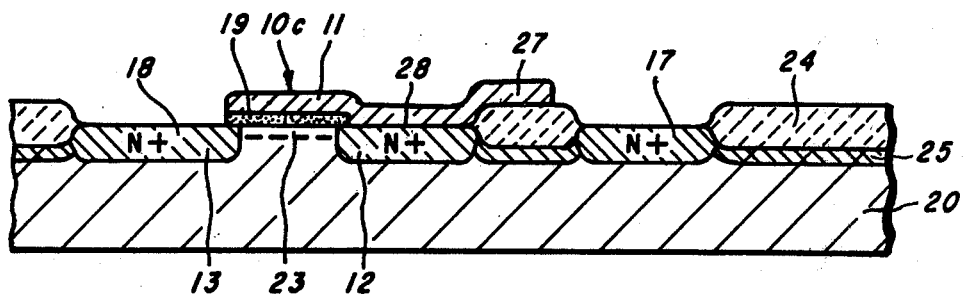

Turning now to FIGS. 4a-4c, a process for making the ROM array of the invention will be described. The starting material is a slice of P-type monocrystalline semiconductor grade silicon, typically 3 inches in diameter; in the FIGS. the portion shown of the bar 20 represents only a very small part of the slice, perhaps less than one mil wide for each part. After appropriate cleaning, the slice is oxidized by exposing to oxygen in a furnace at an elevated temperature to produce an oxide layer 31 over the entire slice of a thickness of about 1000 Å. Next, a layer 32 of silicon nitride of about 1000 Å thickness is formed over the entire slice by conventional methods such as exposing to an atmosphere of dichlorosilane and ammonia in a CVD reactor. A coating of photoresist is applied to the entire top surface of the slice, then exposed to ultraviolet light through a mask which defines the desired pattern of thick field oxide 24 and the P+ channel stop 25. The resist is developed, leaving areas where nitride is then etched away by a nitride etchant, removing the exposed part of the nitride layer 32 but leaving in place the oxide layer 31.

Using the photoresist and nitride as a mask, the slice is now subjected to an ion implant step to produce the channel stop regions 25, whereby boron atoms are introduced into unmasked regions 33 of silicon. The oxide layer 31 is left in place during the implant because it prevents the implanted boron atoms from out-diffusing from the surface during subsequent heat treatment. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

The next step in the process is formation of field oxide 24 which is done by subjecting the slices to steam or an oxidizing atmosphere in a tube furnace at about 1000° C. for several hours. This causes a thick field oxide region or layer 24 to be grown as seen in FIG. 4b, extending into the silicon surface because silicon is consumed as it oxidizes. The remaining parts of the nitride layer 32 mask oxidation. The thickness of this layer 24 is about 10,000 Å, about half of which is above the original surface and half below. The boron doped P+ regions 33 formed by implant will be partly consumed, but will also diffuse further into the silicon ahead of the oxidation front. Thus, P+ field stop regions 25 will result which will be much deeper than the original regions 33.

Next the remaining nitride layer 32 is removed by an etchant which attacks nitride but not silicon oxide, then the oxide 31 is removed by etching and the exposed silicon cleaned. The gate oxide 19 is grown by thermal oxidation to a thickness of about 500 to 800 Angstroms. In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for polysilicon to silicon contacts 28, are patterned and etched at this point using photoresist.

A first layer of polycrystalline silicon is deposited over the entire slice in a reactor using standard techniques. In one method for programming, an ion implant penetrates this layer of polysilicon, so the thickness is only about 3000 Angstroms, compared to about 5000 in the usual silicon gate process. This poly layer is later doped with phosphorus by an N+ diffusion to make it highly conductive. The polysilicon layer is patterned by applying a layer of photoresist, exposing to ultraviolet light through a mask prepared for this purpose, developing, then etching both photoresist and exposed oxide. The remaining photoresist masks certain areas of the polysilicon which define the gates 11 and segments 27, and various other gates and interconnects on the chip. The unmasked polycrystalline silicon is etched away, so the resulting structure is seen in FIG. 4c.

Now the slice is subjected to a standard N+ diffusion operation to produce the N+ drain and source regions 12 and 13 for the transistors 10, as well as the elongated N+ regions 16, 17, and 18. At the same time, the polycrystalline layer including the gate 11 is heavily doped to render it conductive.

If implant programming according to application Ser. No. 890,555 is to be used, up to this point in the process all slices are exactly the same; no programming has been done in the ROM array. The slices are processed routinely to this stage with no requirement for separate inventory controls and separate identification of each lot. An inventory of slices finished up through polysilicon patterning may be maintained for quick response to custom orders for ROM codes. In accordance with application Ser. No. 890,555, the ROM array is programmed by first depositing photoresist and exposing it using a unique mask which defines the ROM code. An aperture is defined over each cell 10 to be programmed as a "0", and each cell 10 to be a "1" is left covered. After developing the slice is subjected to a boron implant at about 180 KeV to a dosage of about $10^{13}$ per sq. cm. The energy level and dosage are dependant upon the thicknesses of the oxide layer 19 and the polysilicon gates 11, as well as the change in threshold desired. At this level, the ion implant penetrates the polycrystalline silicon gate 11 and gate oxide 19 to create an implanted region 23 in the channel area. This implant raises the threshold voltage above about 5 V.; the full logic "1" level will not turn on the transistor. The transistors covered by photoresist will not be implanted so will retain the usual threshold voltage of about 0.8 V. It is important that the mask alignment for creating the apertures for the programming mask is non-critical. The active channel area to be implanted has already been defined in the previous processing steps with thin gate oxide 19.

A thick layer 21 of silicon oxide is deposited by decomposition of silane at a low temperature, about 400° C. This layer 21 insulates the metal level from the polycrystalline silicon level of interconnections, and is referred to as multilevel oxide. The multilevel oxide layer is now patterned by a photoresist operation, exposing the contact areas 22 for a metal-to-polysilicon contact and contact areas for any metal-to-silicon contacts needed in the periphery. Metal contacts and interconnections are used in the periphery of the chip in the input buffers, decorders, sense amplifiers, substrate pump, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves metal strips forming the X address lines 14 and 15 and contacting the polysilicon gates at the contact areas 22.

Although not shown in the figures the slice is next covered with a protective overcoat which may be an oxide or glaze, then this is patterned to expose the bonding pads, and the slice is scribed, broken into individual bars, and the bars mounted in packages.

The purpose of the ion implant for programming the cell array is to change the threshold voltage of some of the transistors 10 relative to the others, depending upon whether a 1 or a 0 is to be stored. The feature of this invention can be used in either P-channel or N-channel ROMs, so, depending on channel type, the proper type of dopant for ion implant is determined. In the embodiment described in detail above, a boron implant is used to increase the threshold voltage such that a transistor 10 is off or inoperative when selected. The normally on device must be enhancement mode.

Instead of programming the ROM array by ion implant after the polysilicon patterning but prior to the interlevel oxide coating, it could be programmed by implant before polysilicon coating. Also, the mask which defined the moat of the gate areas in the ROM array could be the programming mask, early in the process. The advantage of programming late in the process is that all manufacturing masks will be the same and all slices identical up to the point that the programming mask is introduced.

Figure 5:
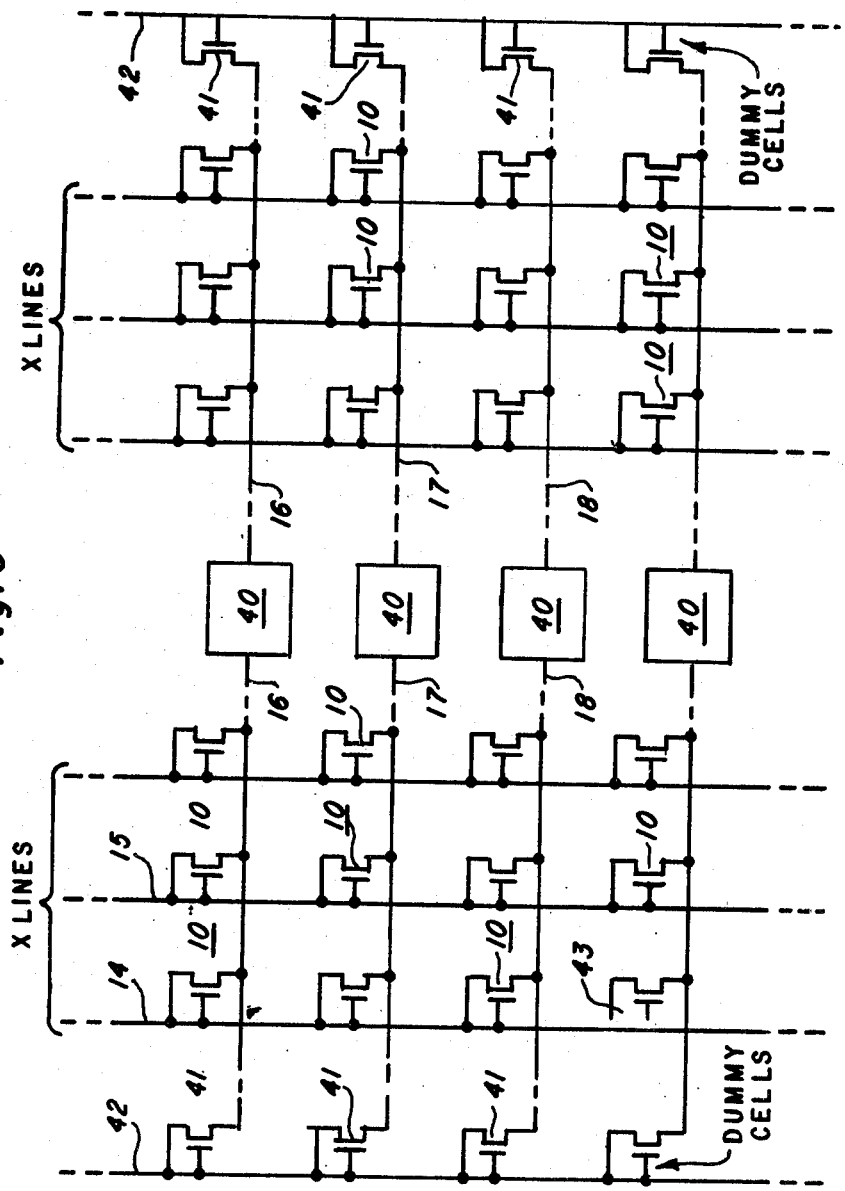
FIG. 5 is an electrical schematic diagram of a ROM array using the features of the invention.

With reference to FIG. 5, a memory array using the cells of the invention is shown. A sense amplifier 40 which may be of the type disclosed in U.S. Pat. No. 4,081,701 issued to White, McAdams and Redwine assigned to Texas Instruments, is positioned at the center of each column line 16, 17 or 18. In a 256×256 array, there would be 128 cells, 10 in each side of each of 256 sense amplifiers 40. A dummy cell 41 is also provided on each side of each sense amplifier and connected to the column line half. The dummy cell is constructed exactly like one of the cells 10 but has a channel W/L ratio of about half that of the cells 10. The dummy cells 41 are addressed by lines 42 by an X address decoder which functions to apply a logic "1" voltage to one of the 256 X address lines 14, 15, etc., and to apply Vss to all the remainder, while applying Vdd to the line 42 on the opposite side of the sense amplifier from the selected cell. The amplifier will detect the difference between the current flowing through the selected cell 10 into the column line and the current flowing through the dummy cell on the other side, as these currents charge the column line halves. The sensing operation will of course be complete long prior to the time the column line halves reach their final logic levels. If the selected cell is a "1", i.e., not implanted, then the current through it is greater than through the dummy cell; if a "0", then vice versa.

The cell array could be contact programmable by having a separate contact location 22 for each gate 11 rather than sharing a segment 27 of polysilicon with two adjacent cells. The mask which opens the aperatures 22 (or leaves selected ones closed) would then be the programming mask. This would result in a slightly larger cell, but a simpler process since the programming implant wouldn't be needed. In FIG. 5, a contact programmed cell would appear in schematic diagram form as a cell 43 where no connection is made from the X line 14 to the drain or gate of this transistor. The array also could be moat programmed, in which case the layout would be the same as FIG. 1, but the moat under the gates would be omitted for selected transistors.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A semiconductor read only memory comprising an array of rows and columns of memory cells, each cell including an insulated gate field effect transistor having source and drain electrodes and a polycrystalline silicon gate electrode with a source-to-drain path between the source and drain electrodes, conductive means shorting the gate electrode of each transistor to one end of its source-to-drain path, elongated column lines each connected to the other end of the source-to-drain path of all of the transistors in a column, and elongated row lines in the form of metal strips each connected to said one end of the source-to-drain path of all of the transistors in a row, the memory cells being programmed to be either conductive or nonconducitve when a logic voltage is applied to the row lines, a segment of polycrystalline silicon forming the gate for each of two adjacent cells, the segment engaging the gate in both of the two adjacent cells, but the row line making only one connection to the segment.

2. A memory according to claim 1 wherein the source and drain electrodes are heavily doped regions in a face of a semiconductor body and wherein the gates are insulated from the face by gate insulators, the gates also making direct contact to said one end of the source-to-drain path by said conductive means which is polycrystalline silicon.

3. A memory according to claim 1 wherein selected ones of the transistors are programmed by implant through the polysilicon gates to render the source-to-drain paths non-conductive when a logic voltage is applied to the row lines.

4. A memory according to claim 1 wherein the memory cells in each column are partitioned in two column line halves and a differential sense amplifier is positioned at the center of each column line, each differential sense amplifier having two inputs, said inputs being separate connected to the column line halves.

* * * * *